(12) United States Patent
Zhou et al.

(10) Patent No.: US 10,862,463 B1
(45) Date of Patent: Dec. 8, 2020

(54) LEVEL SHIFTER FOR HIGH-SPEED GATE DRIVERS

(71) Applicant: University of Electronic Science and Technology of China, Chengdu (CN)

(72) Inventors: Zekun Zhou, Chengdu (CN); Jianwen Cao, Chengdu (CN); Zhuo Wang, Chengdu (CN); He Tang, Chengdu (CN); Bo Zhang, Chengdu (CN)

(73) Assignee: UNIVERSITY OF ELECTRONIC SCIENCE AND TECHNOLOGY OF CHINA, Chengdu (CN)

( * ) Notice: Subject to any disclaimer, the term of this patent is extended or adjusted under 35 U.S.C. 154(b) by 0 days.

(21) Appl. No.: 16/848,864

(22) Filed: Apr. 15, 2020

(30) Foreign Application Priority Data

Jan. 10, 2020 (CN) .......................... 2020 1 0025807
Jan. 10, 2020 (CN) .......................... 2020 1 0026032

(51) Int. Cl.
| | |
|---|---|
| *H03K 19/0185* | (2006.01) |
| *H03K 3/356* | (2006.01) |
| *H03K 3/012* | (2006.01) |
| *H03K 5/134* | (2014.01) |

(52) U.S. Cl.
CPC ....... *H03K 3/356113* (2013.01); *H03K 3/012* (2013.01); *H03K 3/356182* (2013.01); *H03K 5/134* (2014.07); *H03K 19/018521* (2013.01)

(58) Field of Classification Search
CPC ............ H03K 5/13; H03K 5/134; H03K 5/22; H03K 5/24; H03K 5/2436; H03K 5/2445; H03K 5/2463; H03K 5/2472; H03K 3/353; H03K 3/356104; H03K 3/356113; H03K 3/356182; H03K 19/0175; H03K 19/0185; H03K 19/018514; H03K 19/018524; H03K 19/018528
See application file for complete search history.

(56) References Cited

U.S. PATENT DOCUMENTS

| | | | | |
|---|---|---|---|---|
| 4,450,371 A | * | 5/1984 | Bismarck ......... | H03K 3/356017 326/102 |
| 7,268,588 B2 | * | 9/2007 | Sanchez ........... | H03K 3/356113 326/68 |
| 7,768,308 B2 | * | 8/2010 | Maede ............. | H03K 3/356113 326/68 |

(Continued)

*Primary Examiner* — Jason Crawford
(74) *Attorney, Agent, or Firm* — Bayramoglu Law Offices LLC (57) ABSTRACT

A level shifter includes a power supply rail conversion block, an RS latch and a digital detection block. The power supply rail conversion block comprises a first NLDMOS transistor, a second NLDMOS transistor, a first PLDMOS transistor, a second PLDMOS transistor, a first PMOS transistor, a second PMOS transistor, a first NMOS transistor, a second NMOS transistor, and a first inverter. A gate of the first NLDMOS transistor is connected to an input of the first inverter, a drain of the first NLDMOS transistor is connected to a drain of the first PLDMOS transistor; a source of the first NLDMOS transistor and a source of the second NLDMOS are connected to a referenced ground of an LV power supply rail. The digital detection block comprises a second inverter, a third inverter, a first delay chain, a second delay chain, a first NAND gate and a second NAND gate.

8 Claims, 10 Drawing Sheets

(56) References Cited

U.S. PATENT DOCUMENTS

| | | | |
|---|---|---|---|
| 7,816,949 B2* | 10/2010 | Ishikawa | H04L 25/0278 |
| | | | 326/86 |
| 7,956,642 B2* | 6/2011 | Lee | H03K 3/356113 |
| | | | 326/68 |
| 8,368,425 B2* | 2/2013 | Huang | H03K 3/356182 |
| | | | 326/81 |
| 10,771,045 B1* | 9/2020 | Chen | H03K 19/0185 |
| 2002/0059536 A1* | 5/2002 | Saeki | H03L 7/00 |
| | | | 713/500 |
| 2006/0066349 A1* | 3/2006 | Murakami | H03K 3/356113 |
| | | | 326/81 |
| 2011/0227626 A1* | 9/2011 | Sakurai | H03K 19/0175 |
| | | | 327/333 |
| 2015/0381180 A1* | 12/2015 | Tsuji | H03K 3/35613 |
| | | | 327/319 |

\* cited by examiner

LEVEL SHIFTER FOR HIGH-SPEED GATE DRIVERS

CROSS REFERENCE TO THE RELATED APPLICATIONS

This application is based upon and claims priority to Chinese Patent Applications No. 202010026032.4, filed on Jan. 10, 2020, and No. 202010025807.6, filed on Jan. 10, 2020, the entire contents of which are incorporated herein by reference.

TECHNICAL FIELD

The present invention belongs to the field of the gate driver technology for HV (high-voltage) power devices and relates to the level shifter for high-speed gate drivers.

BACKGROUND

With the development of artificial intelligence and 5G, high-performance power converters are required. The gate driver is critical for power converters. In the existing process, the parasitic effect of HV LDMOS is much larger than that of LV (low-voltage) MOSFET. Therefore, LV MOSFET is often used in gate drivers, which can improve the driving performance and reduce the chip area. Because the level shifter can convert signals from the LV region to the HV region, it becomes an indispensable block of gate drivers.

Compared with Si-based power devices, wide-bandgap power devices have a lower parasitic effect and better heat resistance, which are more suitable for high-frequency and miniaturization applications. Thus, to take advantage of wide-bandgap power devices, the level shifter should have a fast response speed and a high dV/dt immunity. Most of HV floating level shifters use LDMOS transistors and the cross-coupling circuit, which are always limited by the speed of the slower response path. A current-type level shifter is also used, which can realize zero static power consumption by using a short-pulse circuit But it has a weaker dV/dt immunity.

Wide-bandgap semiconductors represented by GaN and SiC have wider applications, especially in the HV field. However, the dV/dt noise of wide-bandgap applications is very serious. There are some ways to solve the above problem. In general, the gate resistor or low-driving circuit is used to decrease the drive speed, then the dV/dt noise can be reduced. But it could reduce the switching speed of SiC power devices and increase the switching loss. So, those methods may be unsuitable in high-frequency applications. Currently, the new way, the multi-level gate driver, is proposed to reduce dV/dt noise and di/dt noise. Thus, the excellent performance of wide-bandgap power devices can be employed greatly and the switching speed can not be decreased too much.

However, in the multi-level gate driver, voltage and current of wide-bandgap power devices need to be sampled as a flag signal. Hence, the feedback signal of different power supply rails should be shifted to the right voltage region by the level shifter. Wide-bandgap power devices have fast switching speed, so a fast level shifter is also needed. The feedback signal is easy to be influenced and shows a nonperiodic signal. At present, the high-speed level shifter adopts the short-pulse. When the input signal is aperiodic feedback signal, the above level shifter may be triggered by mistake. Especially for the fully-integrated multi-level gate driver, this will lead to the circuit in the wrong state in subsequent periods. Therefore, in order to meet the requirements of the above applications, the high-speed level shifter needs self-correction functions, which can ensure normal switching operation.

SUMMARY

The invention proposes a level shifter to solve the above problem. The level shifter uses two schemes. One scheme utilizes a digital detection technique to improve the response speed of level shifter. At the same time, the zero static power consumption and high dV/dt immunity can be achieved without any extra circuits. The other scheme adds a self-correction technique based on the first scheme. Thereby, when the level shifter is in an error state, the function can be corrected by using a self-correction technique. This is better applied to high-speed multi-level gate drivers.

The First Scheme:

A level shifter comprises a power rail conversion block, a digital detection block and an RS latch.

The power rail conversion block comprises a first NLDMOS transistor, a second NLDMOS transistor, a first PLDMOS transistor, a second PLDMOS transistor, a first PMOS transistor, a second PMOS transistor, a first NMOS transistor, a second NMOS transistor and a first inverter.

The gate of the first NLDMOS transistor is connected to the input of the first inverter, which is also the input of the level shifter. The drain of the first NLDMOS transistor is connected to the drain of the first PLDMOS and the source of the first NLDMOS is connected to the referenced ground of the LV power supply rail.

The power supply and the referenced ground of the first inverter are connected to that of the LV power supply rail respectively. The output of the first inverter is connected to the gate of the second NLDMOS transistor.

The referenced ground of the HV power supply rail is connected to the gate of the second PLDMOS transistor and the first PLDMOS transistor. The drain of the second NLDMOS transistor is connected to the drain of the second NLDMOS transistor and the source of the second NLDMOS transistor is connected to the gate of the first PMOS transistor and the first NMOS transistor. Drains of the second PMOS transistor and the second NMOS transistor are the second output of the power rail conversion block.

The power supply of the HV power supply rail is connected to the source of the first PMOS transistor and the second PMOS transistor. The drain of the first PMOS transistor is connected to the drain of the first NMOS transistor and the source of the first PLDMOS transistor. Gates of the second PMOS transistor and the second NMOS transistor are the first output of the power rail conversion block.

Sources of the first NMOS transistor and the second NMOS transistor are connected to the referenced ground of the HV power supply rail.

The digital detection block comprises a second inverter, a third inverter, a first delay chain, a second delay chain, a first NAND gate and a second NAND gate.

The input of the second inverter is connected to the first output of the power supply rail conversion block. The output of the second inverter is connected to the first input of the first NAND gate and the input of the first delay chain. The output of the first delay chain is connected to the second input of the first NAND gate.

The output of the first NAND gate is connected to the S terminal of the RS latch.

The input of the third inverter is connected to the second output of the power supply rail conversion block. The output of the third inverter is connected to the first input of a second NAND gate and the input of the second delay chain. The output of the second delay chain is connected to the second input of the second NAND gate.

The output of the second NAND gate is connected to the R terminal of the RS latch.

The RS latch comprises a third NAND gate and a fourth NAND gate.

The first input of the fourth NAND gate is the R terminal of the RS latch. The second input of the fourth NAND gate is the output of the RS latch, which is connected to the output of the third NAND gate. The output of the fourth NAND gate is connected to the second input of the third NAND gate.

The first input of the third NAND gate is the S terminal of the RS latch.

Two delay chains have three inverters.

The proposed level shifter in the first scheme uses a digital detection block, which can respond to the fast path. For the input signal of the level shifter, whether it is flipped from low to high or from high to low, the fast path affects the response speed of the level shifter. When the input signal IN becomes high and the first NLDMOS transistor M1 is turned on, the path of nodes A and C is the fast path. When the input signal IN becomes low and the second NLDMOS transistor M2 is turned on, the path of nodes B and D is the fast path. Therefore, it can be known that the proposed level shifter in the invention avoids the influence of the slow path and the response speed of the proposed can be improved greatly.

The Second Scheme:

A level shifter for multi-level gate drivers, which includes a power supply rail conversion block, a pull-up block, a digital block and an RS latch.

The power supply rail conversion block comprises a first NLDMOS transistor, a second NLDMOS transistor, a first PLDMOS transistor, a second PLDMOS transistor, a first PMOS transistor, a second PMOS transistor, a first NMOS transistor, a second NMOS transistor and a first inverter.

The gate of the first NLDMOS transistor is connected to the input of the first inverter, which is the input of the level shifter. The drain of the first NLDMOS transistor is connected to the drain of the first PLDMOS and the source of the first NLDMOS is connected to the referenced ground of the LV power supply rail.

The power supply and the referenced ground of the first inverter are connected to that of the LV power supply rail respectively. The output of the first inverter is connected to the gate of the second NLDMOS transistor.

The referenced ground of the HV power supply rail is connected to the gate of the second PLDMOS transistor and the first PLDMOS transistor. The drain of the second NLDMOS transistor is connected to the drain of the second NLDMOS transistor and the source of the second NLDMOS transistor is connected to the gate of the first PMOS transistor and the first NMOS transistor. Drains of the second PMOS transistor and the second NMOS transistor are the second output of the power supply rail conversion block.

The power supply of the HV power supply rail is connected to the source of the first PMOS transistor and the second PMOS transistor. The drain of the first PMOS transistor is connected to the drain of the first NMOS transistor and the source of the first PLDMOS transistor. Gates of the second PMOS transistor and the second NMOS transistor are the first output of the power supply rail conversion block.

Sources of the first NMOS transistor and the second NMOS transistor are connected to the referenced ground of the HV power supply rail.

The digital block comprises a first delay chain, a second delay chain, a fourth inverter, a fifth inverter, a first NOR gate, a second NOR gate, a third NOR gate, a fourth NOR gate, a first AND gate and a second AND gate.

The input of the first delay chain is connected to the first input of the first nor-gate. The first input of the second AND gate is connected to the first output of the power supply rail conversion block. The output of the second AND gate is connected to the second input of the first NOR gate.

The input of the second delay chain is connected to the first input of the second NOR gate. The first input of the first AND gate is connected to the second output of the power supply rail conversion block. The output of the first AND gate is connected to the second input of the second NOR gate.

The output of the first inverter and the input of the third NOR gate are connected to the input of the fourth inverter. The output of the fourth inverter is connected to the second input of the first AND gate.

The output of the second inverter and the input of the fourth NOR gate are connected to the input of the fifth inverter. The output of the fifth inverter is connected to the second input of the second AND gate.

The second input of the third NOR gate is connected to the output of the first AND gate. The output of the third NOR gate connected to the S terminal of the RS latch.

The second input of the fourth NOR gate is connected to the output of the second AND gate. The output of the fourth NOR gate is connected to the R terminal of the RS latch.

The pull-up block includes the third PLDMOS transistor and the fourth PLDMOS transistor. The source of the third PLDMOS transistor is connected to the power supply of the HV power rail. The gate of the third PLDMOS transistor is connected to the output of the fifth INV. The drain of the third PLDMOS transistor is connected to the drain of the first NLDMOS transistor and the first PLDMOS. The source of the fourth PLDMOS transistor is connected to the power supply of the HV power rail. The gate of the fourth PLDMOS transistor is connected to the output of the fourth inverter. The drain of the third PLDMOS transistor is connected to the drain of the second NLDMOS transistor and the second PLDMOS.

The RS latch comprises a third NAND gate and a fourth NAND gate.

The first input of the fourth NAND gate is the R terminal of the RS latch. The second input of the fourth NAND gate is the output of the RS latch, which is connected to the output of the third NAND gate. The output of the fourth NAND gate is connected to the second input of the third NAND gate.

The first input of the third NAND gate is the S terminal of the RS latch.

Two delay chains have three inverters.

The first scheme and the second scheme both use the digital block to sample the fast path. The effect of the slow path on the speed is avoided and the response speed of the proposed level shifter is improved significantly. Compared with the first scheme, the digital block in the second scheme makes the output of the level shifter is determined by either the fast path or the slow path. When the input of the level shifter is a periodic pulse signal, the fast path can guarantee a fast response speed. While the input of level shifter is an aperiodic pulse signal, such as feedback signal in multi-level gate drivers, the slow path can ensure that the output is consistent with the input. Therefore, the proposed level shifter in the second scheme has a self-correction function, which can not keep the level shifter in an error state all the way.

The advantages of the invention are as follows: the invention makes use of the high-speed response of the fast path to overcome the problem of low response speed of the traditional level shifter. Then, the response speed of the level shifter only depends on the delay of the logic gate, which improves the response speed significantly. The proposed level shifter in the first scheme can achieve zero static power consumption and ultra-high dV/dt immunity, which can be widely used in the driving circuit with high requirements on power consumption, response speed, and dV/dt immunity. The digital block in the second scheme has the self-correction function to correct the level shifter. At the same time, the proposed level shifter in the second scheme also has advantages of the first scheme, such as zero static power consumption, high dV/dt immunity and high response speed, which can be appropriately applied to the multi-level gate driver of wide-bandgap power devices.

DETAILED DESCRIPTION OF THE EMBODIMENTS

The present invention will be further described below refer to the attached figures and specific examples.

The present invention proposes a level shifter with the first scheme, which has three sub-blocks: a power supply rail conversion block, a digital detection block and an RS latch. The power supply rail uses LDMOS (M1, M2, M3, M4) and LV MOSFET (M5, M6, M7, M8). LDMOS transistors are used to convert signals from the LV region to the HV region. LV MOSFETs are used in the HV region. The referenced ground and power supply in the LV region are VSSL and VDDL respectively, while those in the HV region are VSSH and VDDH respectively.

Figure 1:
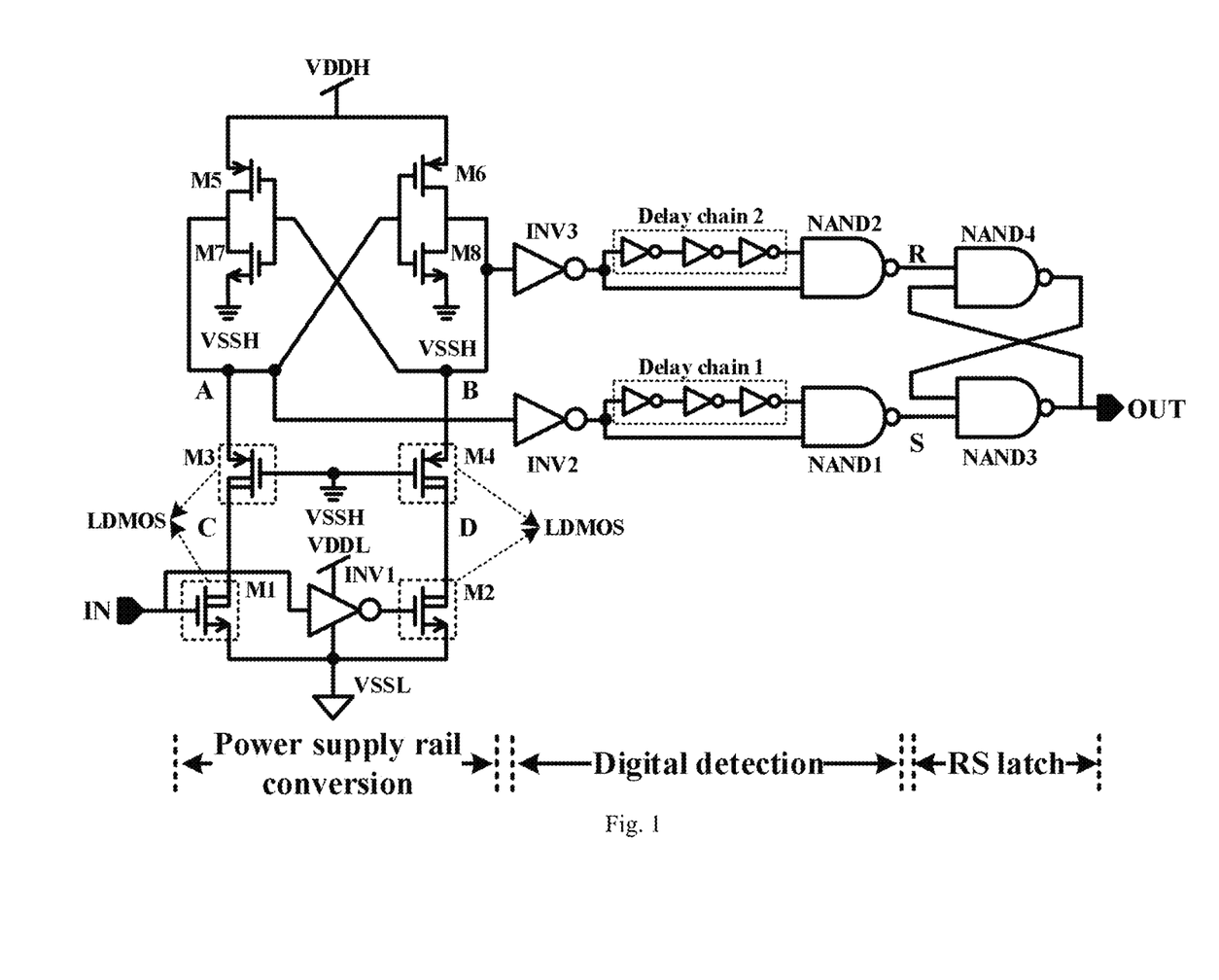
FIG. 1 is a schematic of the first level shifter provided in the present invention.
Figure 6:
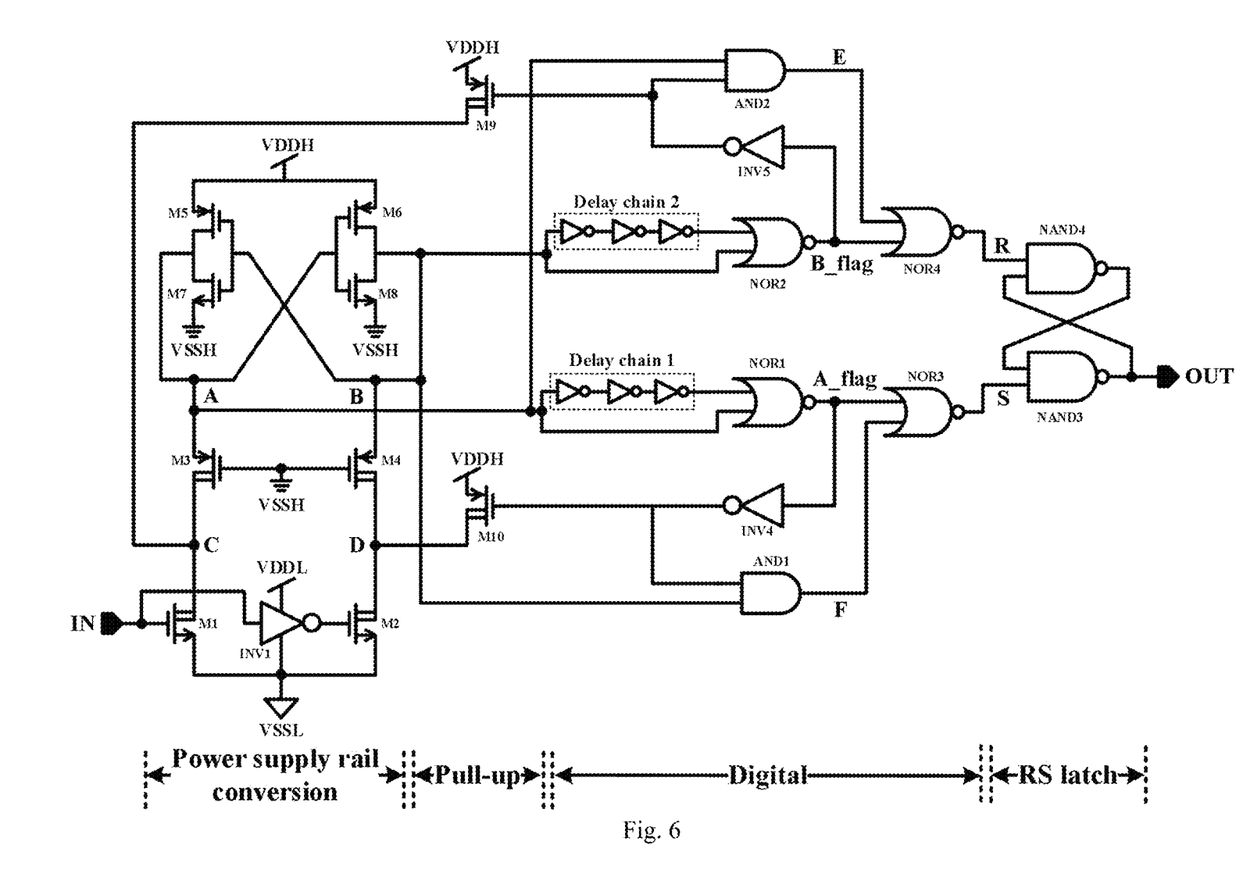
FIG. 6 is a schematic of the second level shifter provided in the present invention.

The power supply rail conversion in FIG. 1 and FIG. 6 comprises a first NLDMOS transistor M1, a second NLDMOS transistor M2, a first PLDMOS transistor M3, a second PLDMOS transistor M4, a first PMOS transistor M5, a second PMOS transistor M6, a first NMOS transistor M7, a second NMOS transistor M8, and a first inverter INV1. The gate of the first NLDMOS transistor M1 is connected to the input of the first inverter INV1 and also serves as the input signal IN of the level shifter. The drain of the first NLDMOS transistor M1 is connected to the drain of the first PLDMOS transistor M3. The source of the first NLDMOS transistor M1 is connected to the source of the second NLDMOS transistor M2, where they are connected to the referenced ground VSSL in the LV region. The power supply and the referenced ground of the first inverter INV1 are connected to VDDL and VSSL. The output of the first inverter INV1 is connected to the gate of the second NLDMOS transistor M2. The gate of the second PLDMOS transistor M4 and the first PLDMOS transistor M3 are connected to the referenced ground VSSH in the HV region. The drain of the second PLDMOS transistor M4 is connected to the drain of the second NLDMOS transistor M2. The source of the second PLDMOS is connected to the gate of the first PMOS transistor M5 and the first NMOS transistor M7. The drain of the second PMOS transistor M6 and the second NMOS transistor M8 can serve as the second output of the power supply rail conversion. The source of the first PMOS transistor M5 and the second PMOS transistor M6 are connected to VDDH. The drain of the first PMOS transistor is connected to the drain of the first NMOS transistor M7. The source of the first PLDMOS transistor, the gate of the second PMOS transistor M6, and the gate of the second NMOS transistor M8 are the first output of the power supply rail conversion. The source of the first NMOS transistor M7 and the second NMOS transistor M8 are connected to VSSH.

The RS latch is used to stabilize the output of the level shifter at the right state. The RS latch in FIG. 1 and FIG. 6 comprises a third NAND gate NAND3 and a fourth NAND gate NAND4. The first input of the fourth NAND gate NAND4 acts as the R terminal of the RS latch. The second input of the fourth NAND gate NAND4 is connected to the output of the third NAND gate NAND3, which is acted as the output of the RS latch. The output of the fourth NAND gate NAND4 is connected to the first input of the third NAND gate NAND3. The output of the RS latch is also the output of the level shifter. The second input of the third NAND gate NAND3 is served as the S terminal of the RS latch.

For the first scheme in the present invention:

In FIG. 1, the digital detection block uses a second inverter INV2, a third inverter INV3, a first delay chain, a second delay chain, a first NAND gate NAND1 and a second NAND gate NAND2. The input of the second inverter INV2 is the first output of the power rail conversion. The output of the second inverter INV2 is connected to the input of the first delay chain and the second input of the first NAND gate NAND1. The output of the first NAND gate NAND1 is connected to the S terminal of the RS latch. The input of the third inverter INV3 is connected to the second input of the power supply rail conversion. The output of the third inverter INV3 is connected to the input of the second delay chain and the second input of the second NAND gate NAND2. The output of the first delay chain is connected to the second input of the first NAND gate NAND1 and the output of the second delay chain is connected to the second input of the second NAND gate NAND2. The output of the second NAND gate NAND2 is connected to the R terminal of the RS latch.

Two delay chains have three inverters.

For the first scheme in the invention, the mechanism of the level shifter is illustrated by the example of the input signal IN flipping from low to high.

When the input signal IN is high, the first NLDMOS transistor M1 is turned on and node C (the drain of the first LDMOS transistor) is pulled down rapidly. At the same time, the first PLDMOS transistor M3 is also turned on and node A is pulled down quickly. VA isn't lower than VSSH due to the first PLDMOS transistor M3. After VA is lower the inversion voltage of the second inverter INV2, the output of the second inverter INV2 is high and the digital detection block responds. The first input of the first NAND gate NAND1 is connected to the output of the second inverter INV2 and the other input of the first NAND gate NAND1 maintains high due to the first delay chain. Therefore, the input of the first NAND gate NAND1 becomes low. That is, the S terminal of the RS latch block is low. Then, the RS latch can be triggered owing to the S terminal changes from high to low, which means the output of the level shifter turns high. When IN is high, the response speed of nodes A and C is very fast due to the stronger pull-down ability of the first NLDMOS transistor M1 and the first PLDMOS transistor M3. At a moment, the second NLDMOS transistor M2 and the second PLDMOS transistor M4 are turned off, so nodes B and D are pulled up by the second PMOS transistor M6. To make the drop voltage of node A lower than the inversion voltage of the second inverter INV2 and realize the high-speed level shifter, the pull-up ability of the first PMOS transistor M5 is far less than that of the first PLDMOS transistor M3. Of course, the pull-up ability of the second PMOS transistor M6 is the same as that of the first PMOS transistor M5. As a result, the slow path composed of nodes B and D has a slow response speed. Because node B changes from high to low, the digital detection block doesn't respond about node B and the R terminal of the RS latch keeps high. Thus, when the S terminal becomes low, the output of the level shifter is high. When VD is close to VB, nodes B and D rise simultaneously. The first NMOS transistor M7 is turned on and the first PMOS transistor M5 is turned off gradually. Then, node A decreases. With node A decreasing, the pull-up ability of the second PMOS transistor M6 becomes large and the second NMOS transistor M8 is turned off. Finally, node A is VSSH, node C is VSSL, and nodes B and D are VDDH. The R and S of the SR latch keep high to make the output of the level shifter maintain high. According to the above analysis, the delay of the level shifter only depends on the delay of the fast path and logic gate. The LDMOS has a very stronger pull-down ability, the delay of the level shifter is determined by the digital detection block and RS latch. Hence, it can be seen that the delay of the level shifter in the invention can be reduced greatly and is related to the process node.

Figure 2A:
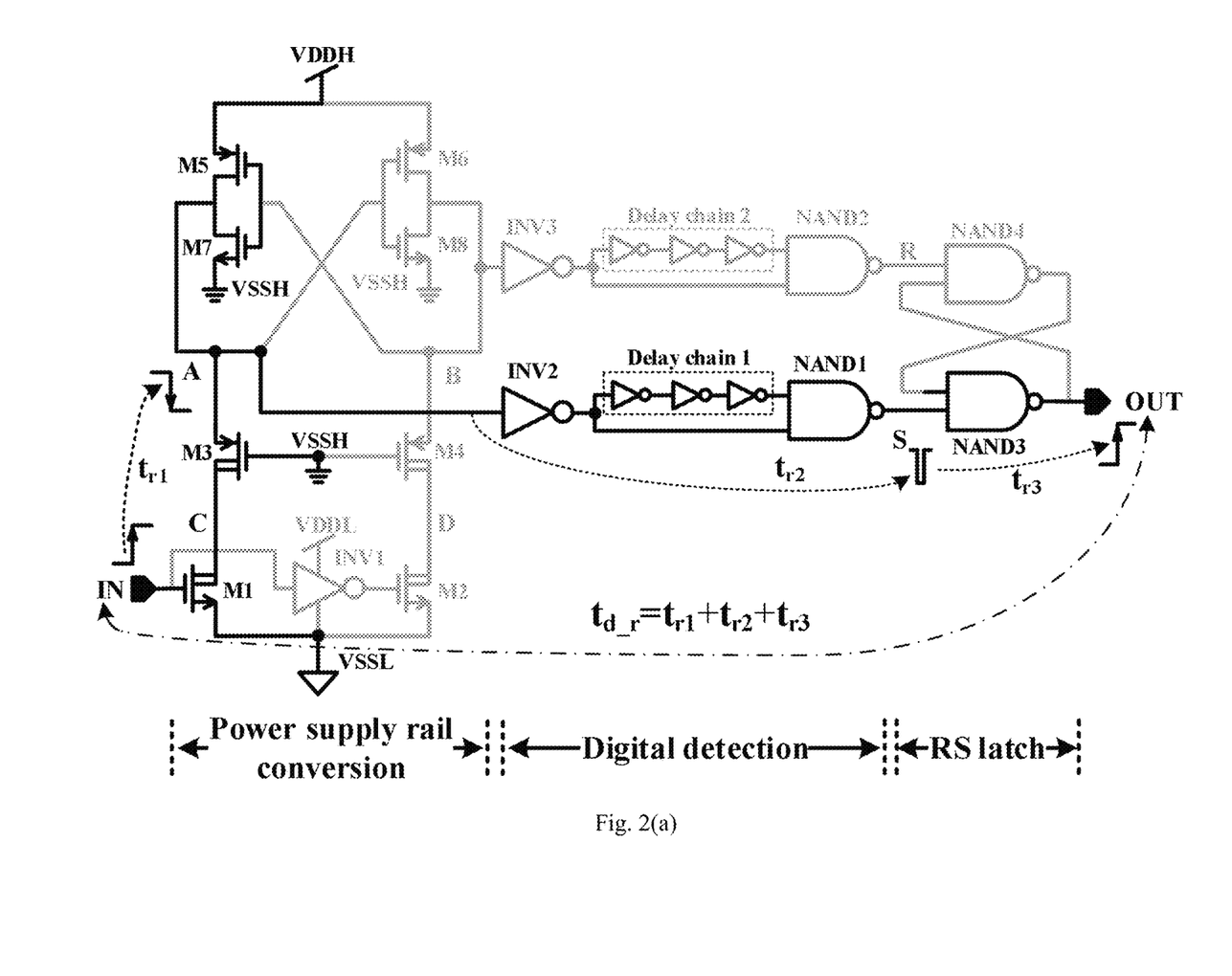
FIG. 2(a) and FIG. 2(b) show the low-to-high transition signal flowing of the first level shifter.
Figure 2B:
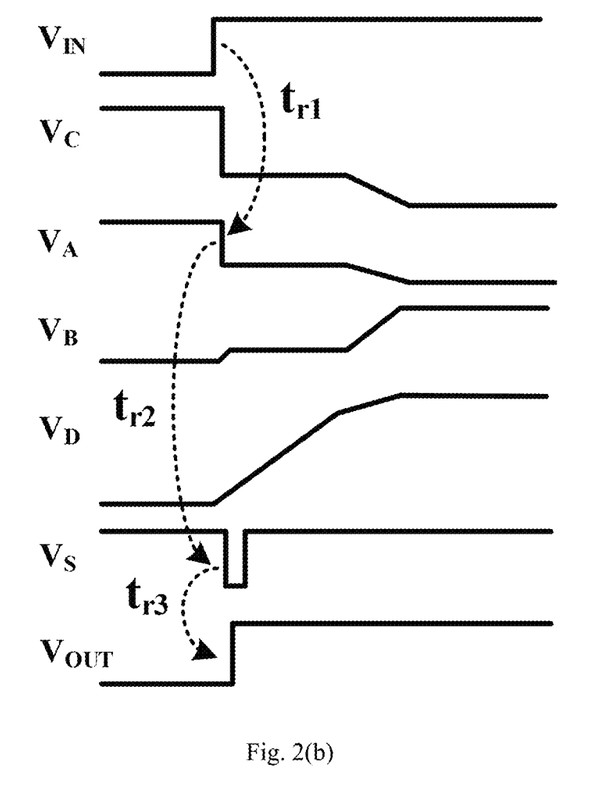

The low-to-high transition signal flow of the level shifter is shown in FIG. 2(a) and FIG. 2(b). In FIG. 2(b), the signal from IN to OUT can pass through the fast path composed of the first NLDMOS transistor M1 and the first PLDMOS transistor M3, and the delay from IN to node A is called tr1. After that, the second inverter INV2 and the first NAND gate NAND1 respond. The tr2 represents the delay of the above logic gates and is mainly composed of the delay of the second inverter INV2 and the first NAND gate NAND1. Finally, the RS latch responds and the delay of the RS latch (the third NAND gate NAND3) is named by tr3. Waveforms of the main nodes are shown in FIG. 2(b).

Figure 3A:
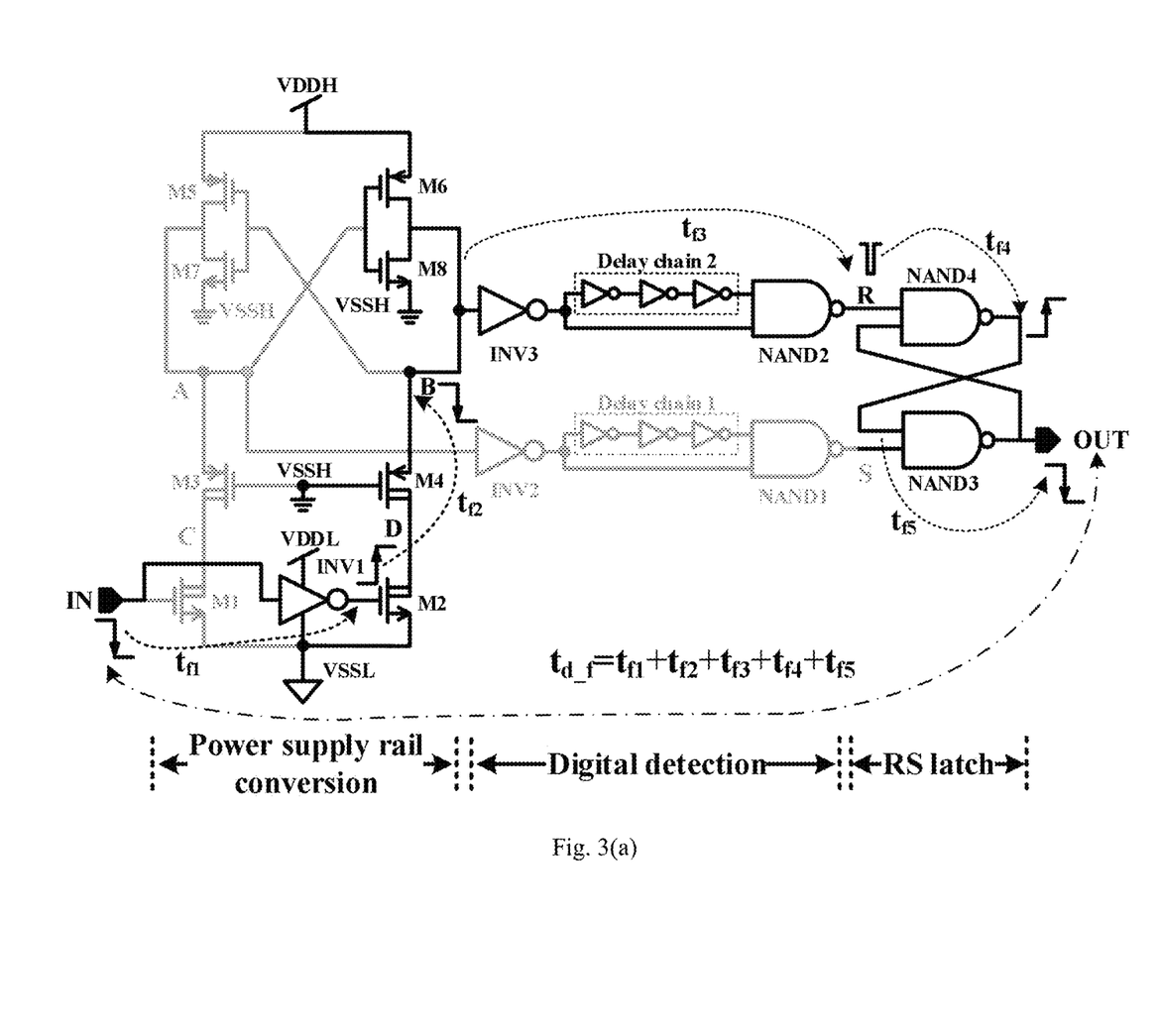
FIG. 3(a) and FIG. 3(b) show the high-to-low transition signal flowing of the first shifter.
Figure 3B:
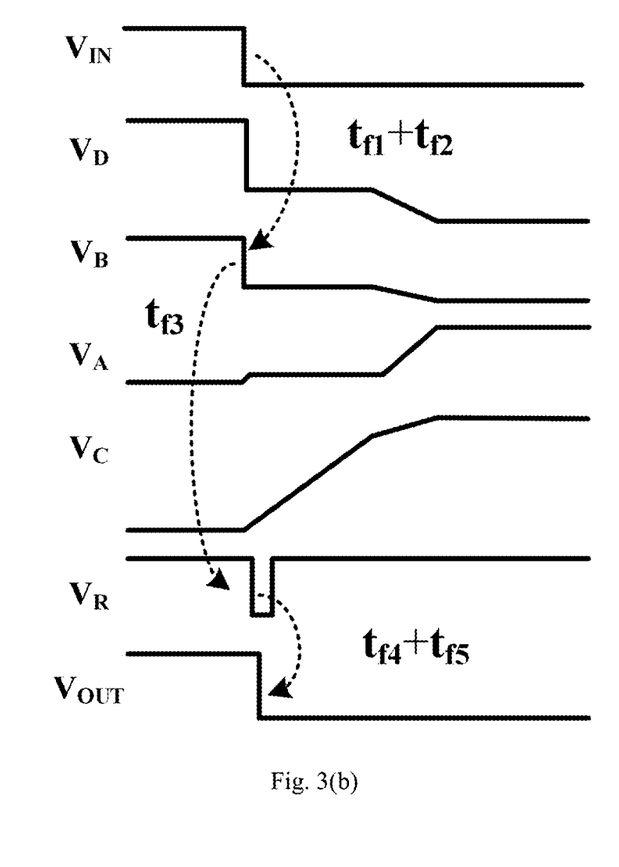

Similarly, the high-to-low transition signal flowing of the level shifter is shown in FIG. 3(a) and FIG. 3(b). In FIG. 3(b), the switching operation has a lot in common as in FIG. 2(b). Due to the symmetry of the level shifter, tr1, tr2 and tr2 in FIG. 2(b) are equal to tf2, f3, and tf5 in FIG. 3(b) respectively. The difference is that the falling delay of the level shifter is added by tf1 and tf4, which is the delay of the first inverter INV1 and the fourth NAND gate NAND4. Although the falling delay is greater than the rising delay, they depend on the delay of several logic gates, which can ensure the delay is less than nanoseconds and can meet the requirements of the high-speed gate driver.

Figure 4:
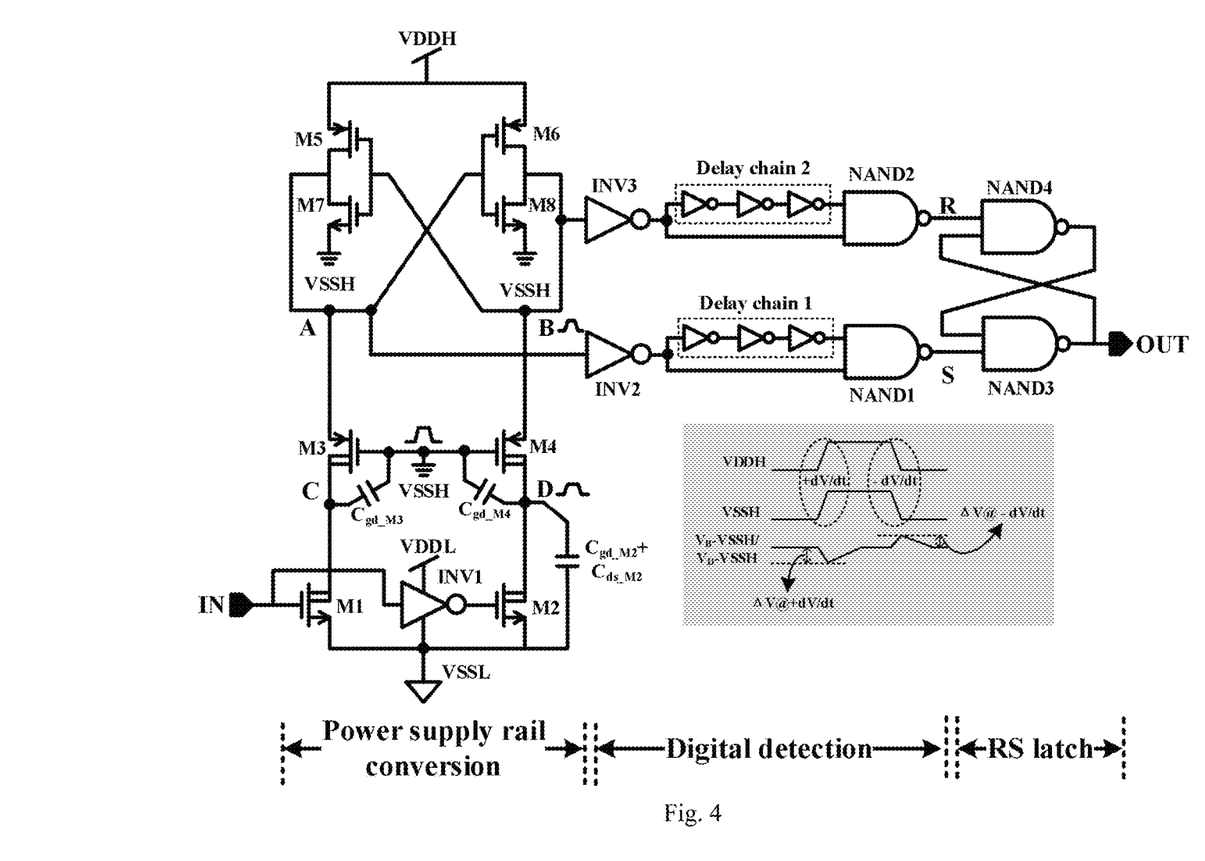
FIG. 4 is a diagram of the main affected parasitic capacitors of the first level shifter due to the dV/dt noise of the HV power supply rail.

FIG. 4 shows that a diagram of the main affected parasitic capacitors of the first level shifter due to the dV/dt noise of the HV power supply rail. The main parasitic capacitors are parasitic capacitors of LDMOS at the drain, which have a larger active area. LV MOSFET transistors have small size and parasitic capacitors can be ignored. Here, the dV/dt immunity of the level shifter is analyzed when the input signal IN is high. As mentioned above, when IN is high, the first NLDMOS transistor M1 has a strong pull-down ability. So, VC has a small variation by dV/dt of HV power supply rail. Furthermore, the current generated by dV/dt of HV power supply rail passes through the gate-drain capacitor of the first PLDMOS transistor M3-Cgd_M3 instead of the channel of the first PLDMOS transistor M3, which has little effect on node A. At the same time, the first PLDMOS transistor M3 has a stronger pull-down ability, which can make VA closer to VSSH. Besides, VA cannot be pulled down more than a diode drop below VSSH due to the body diode of the first NMOS transistor M7. Therefore, when VSSH and VDDH have varied, the VA keeps low and the second PMOS transistor M6 is on. However, since a second PMOS transistor M6 doesn't have enough pull-up ability, VB and VD might be affected by dV/dt of HV power supply rail. Hence, the transient response of VB and VD should be carefully analyzed for the analysis of dV/dt immunity.

When VSSH and VDDH rise at the same rate, the current on the gate-drain capacitor of the second PLDMOS transistor M4-Cgd_M4 and the second PMOS transistor M6 would charge the gate-drain capacitor of the second NLDMOS transistor M2-Cgd_M2 and the drain-source capacitor of the second NLDMOS transistor M2-Cds_M2 and VD can rise rapidly. When VSSH and VDDH finish rising, current on the second PMOS transistor M6 can pull VB and VD to VDDH. VB is always greater than VD. Due to a large capacitor, the gate-drain capacitor of the second PLDMOS transistor M4-Cgd_M4, dVD/dt is closer to dVSSH/dt, which makes VB-VSSH maintain a high value. At the same time, the inversion voltage of the second inverter INV2 and the second inverter INV3 is in the middle, which allows the VB-VSSH can withstand a large drop. Therefore, the level shifter can tolerate a higher positive dV/dt of the HV power supply rail. When VSSH and VDDH fall at the same rate, the gate-drain capacitor of the second NLDMOS transistor M2-Cgd_M2 and the drain-source capacitor of the second NLDMOS transistor M2-Cds_M2 discharge to the gate-drain capacitor of the second PLDMOS transistor M4-Cgd_M4 and the body diode of the second PLDMOS transistor M4 and the second PMOS transistor M6, which cause VB and VD decreasing with VDDH falling and dV/dt of VB and VD are smaller than that of VDDH. Of course, VB-VDDH does not exceed a diode drop by the body-diode clamping of a second PMOS transistor M6. When the input signal IN is low, the analysis is similar to the above.

Figure 5:
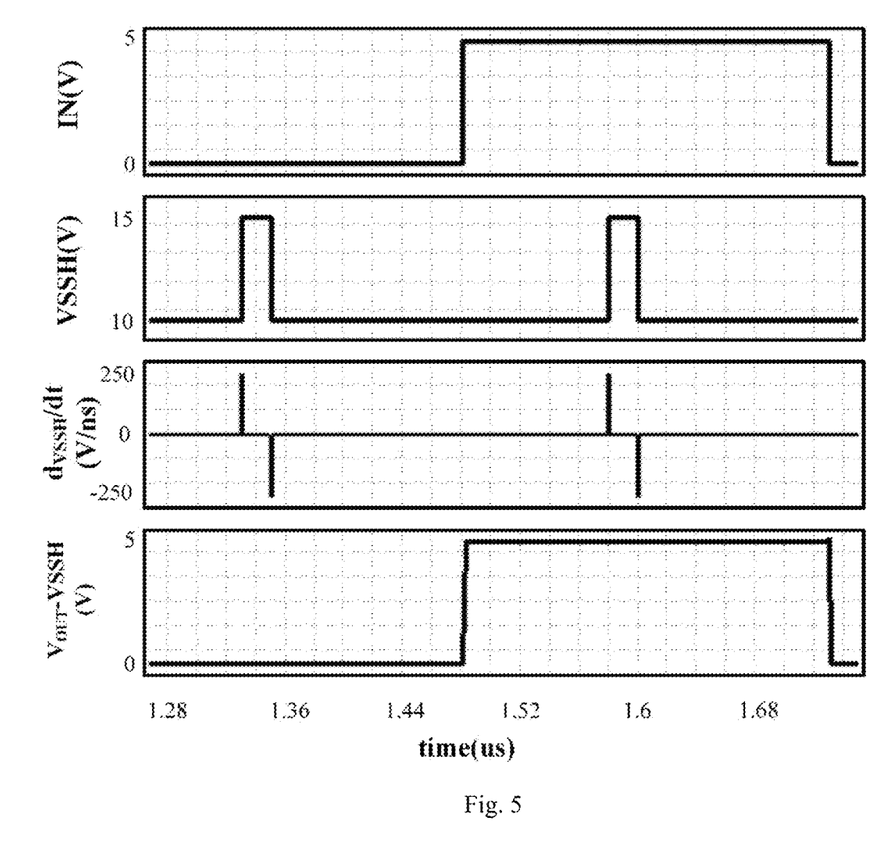
FIG. 5 is a verified diagram of the dV/dt immunity for the first level shifter.

FIG. 5 shows the simulation result of the dV/dt immunity of the first level shifter. It can be seen that the level shifter in the invention is not triggered by mistake when dV/dt of the HV power supply rail is 250V/ns.

In a word, the response speed of the first level shifter, by using the first scheme, is very fast, which only depends on the delay of the fast path and logic gates. At the same time, the level shifter can have high dV/dt immunity without adding complicated auxiliary circuits. In a steady-state, all the transistors of the level shifter are in off, which means zero static power consumption can be obtained.

The Second Scheme:

In FIG. 6, the second scheme is realized in the second level shifter. The digital block utilizes LV MOSFET transistors, which is to deal with the output signal of the power supply rail. The digital block comprises a first delay chain, a second delay chain, a fourth inverter INV4, a fifth inverter INV5, a first NOR gate NOR1, a second NOR gate NOR2, a third NOR gate NOR3, a fourth NOR gate NOR4, a first AND gate AND1, and a second AND gate AND2. The input of the first delay chain is connected to the input of the NOR gate NOR1, the first input of the second AND gate AND2, and the output of the power supply rail conversion, the output of the first delay chain is connected to the second input of the first NOR gate NOR. The input of the second delay chain is connected to the input of the second NOR gate NOR2, the first input of the first AND gate AND1 and the second output of the power supply rail conversion, and the output of the second delay chain is connected to the second input of the second NOR gate NOR2. The input of the fourth inverter INV4 is connected to the output of the first NOR gate NOR1 and the first input of the third NOR gate NOR3, and the output of the fourth inverter INV4 is connected to the second input of the first AND gate AND1 and the output of the power supply rail conversion. The input of the fifth inverter INV5 is connected to the output of the second NOR gate NOR2 and the first input of the fourth NOR gate NOR4, and the output of the fourth inverter INV5 is connected to the second input of the second AND gate AND2 and the third output of the power supply rail conversion. The second input of a third NOR gate NOR3 is connected to the output of the first AND gate AND1, and the output of a third NOR gate NOR3 is connected to the S terminal of the RS latch. The second input of the fourth NOR gate NOR4 is connected to the output of the second AND gate AND2, and the output of the fourth NOR gate NOR4 is connected to the R terminal of the RS latch.

Two delay chains use three inverters.

In some level shifters, the pull-up circuit is used to reduce the dynamic power consumption. As shown in FIG. 6, the pull-up circuit includes a third PLDMOS transistor M9 and a fourth PLDMOS transistor M10. The source of the third PLDMOS transistor M9 is connected to VDDH, the gate of the third PLDMOS transistor M9 is connected to the output of the fifth inverter INV5, and the drain of the third PLDMOS transistor M9 is connected to the second output of the power supply rail conversion. The source of the fourth PLDMOS transistor M10 is connected to VDDH, the gate of the fourth PLDMOS transistor M10 is connected to the output of the fourth inverter INV4, and the drain of the fourth PLDMOS transistor M10 is connected to the fourth output of the power supply rail conversion.

Figure 7A:
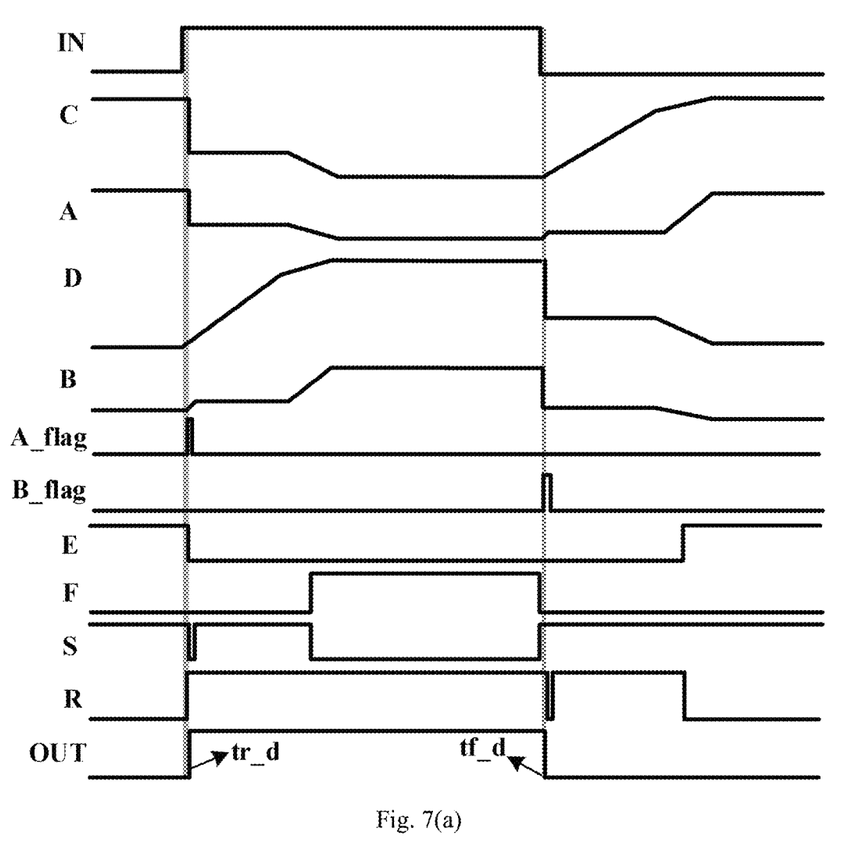
FIG. 7(a) and FIG. 7(b) show the waveform of key nodes for the second level shifter provided in the present invention.
Figure 7B:
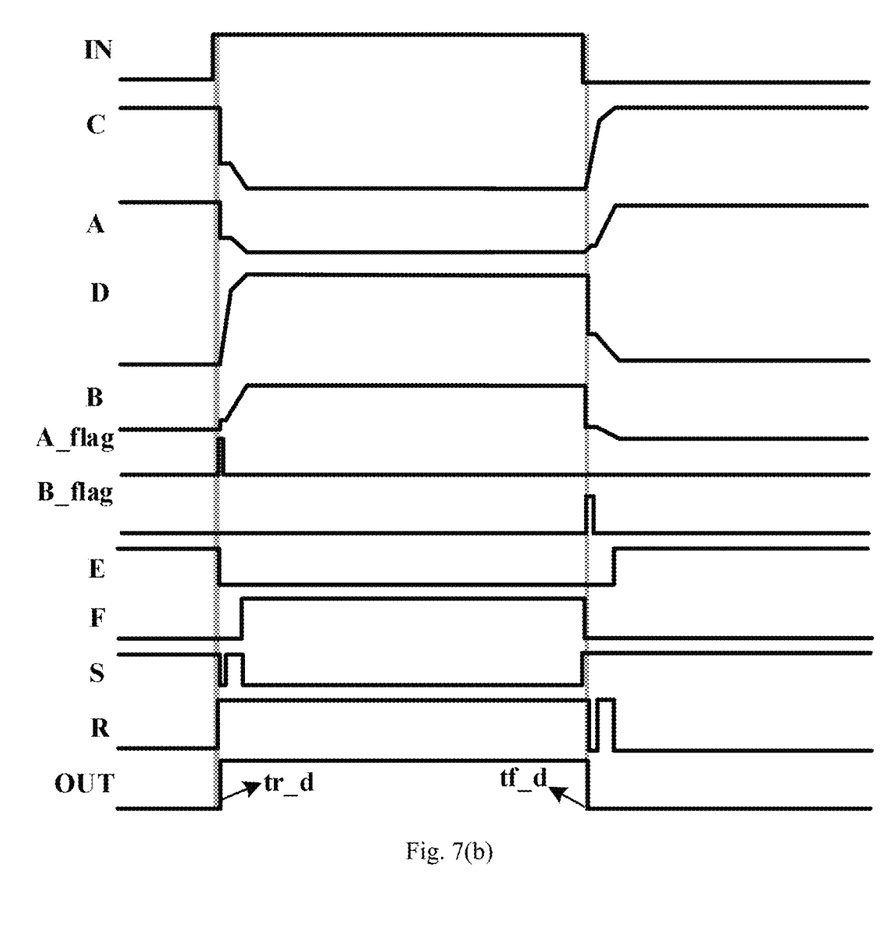

The principle of the second level shifter proposed in the present invention is described below by combining the FIG. 7(a) and FIG. 7(b).

During the low-to-high transition of the level shifter, the first NLDMOS transistor M1 and the first PLDMOS transistor M3 are turned on and nodes A and C are low rapidly. When the voltage of node A is lower than the inversion voltage of the first NOR gate NOR1, the output of the first NOR gate, A_flag, becomes high. The output of the second NOR gate NOR2, B_flag, is a low signal, so the input of the second AND gate AND2 is also a low signal by the fifth inverter INV5. Hence, the output of the fourth NOR gate NOR4 is high due to a low signal at node E, the output of a second AND gate AND2. Therefore, the R terminal of the RS latch is high. Because the output of the third NOR gate NOR3, the R terminal of the RS latch, is low, the output of the level shifter flip from low to high.

When the input signal IN of the level shifter is a pulse signal, the principle of the second level shifter is the same as that of the first level shifter. Although the second level shifter has the advantages of high speed, high dV/dt immunity, and zero static power consumption, it has other merits, lower dynamic power consumption, and self-correction.

In some embodiments, the auxiliary pull-up path is added. For the second level shifter, when the signal A_flag is high, the fourth PLDMOS transistor M10 is turned on through the fourth inverter INV4, which can pull nodes B and D to VDDH quickly. Thus, the response time of the slow path can be shortened and the average power consumption of the level shifter can also be reduced, as shown in FIG. 7(b). FIG. 7(a) shows the transient response of the level shifter without auxiliary pull-up path, and the slow path response is slower.

When the input signal IN is high, node A is VSSH and node B is VDDH. Because nodes A and B are constant voltage, A_flag and B_flag still maintain low Node A is low, the output of the second AND gate AND2, and node E is also low. Similarly, the output of the third NOR gate NOR3 is low Therefore, the output of the level shifter can be consistent with the input signal IN. when the level shifter has any error, it can recover the right state by the above method. This is the self-correction function.

It can be seen that no matter what signal at IN, the digital block can ensure the OUT is correct. At the same time, during the startup, the second level shifter has the right function without an extra startup circuit or enable signal. All in all, the level shifter by using the second scheme can achieve the self-correction through a digital block, and the dynamic power consumption can be reduced by adding the pull-up circuit at the slow path. Therefore, the level shifter has a bigger advantage in real wide-bandgap applications.

The invention claimed is:

1. A level shifter comprising a power supply rail conversion block and an RS latch, wherein the power supply rail conversion block comprises a first NLDMOS transistor, a second NLDMOS transistor, a first PLDMOS transistor, a second PLDMOS transistor, a first PMOS transistor, a second PMOS transistor, a first NMOS transistor, a second NMOS transistor, and a first inverter;

a gate of the first NLDMOS transistor is connected to an input of the first inverter, and the gate of the first NLDMOS transistor serves as an input of the level shifter; a drain of the first NLDMOS transistor is connected to a drain of the first PLDMOS transistor; a source of the first NLDMOS transistor and a source of the second NLDMOS transistor are connected to a referenced ground of an LV power supply rail;

a power supply of the first inverter is connected to a power supply of the LV power supply rail, a referenced ground of the first inverter is connected to the referenced ground of the LV power supply rail; an output of the first inverter is connected to a gate of the second NLDMOS transistor;

a gate of the second PLDMOS transistor and a gate of the first PLDMOS transistor are connected to a referenced ground of an HV power supply rail; a drain of the second PLDMOS transistor is connected to a drain of the second NLDMOS transistor; a drain of the second PMOS transistor and a drain of the second NMOS transistor serve as a second output of the power supply rail conversion block;

a source of the first PMOS transistor and a source of the second PMOS transistor are connected to a power supply of the HV power supply rail; a drain of the first PMOS transistor is connected to a drain of the first NMOS transistor; a source of the first PLDMOS transistor, a gate of the second PMOS transistor and a gate of the second NMOS transistor serve as a first output of the power supply rail conversion block;

a source of the first NMOS transistor and a source of the second NMOS transistor are connected to the referenced ground of the HV power supply rail;

wherein, the level shifter further comprises a digital detection block; the digital detection block comprises, a first delay chain, a second delay chain, a first logical gate and a second logical gate;

wherein, the RS latch comprises a third NAND gate and a fourth NAND gate;

a first input of the fourth NAND gate acts as an R terminal of the RS latch; a second input of the fourth NAND gate is connected to an output of the third NAND gate, and the second input of the fourth NAND gate is an output of the RS latch; an output of the fourth NAND gate is connected to a first input of the third NAND gate; and a second input of the third NAND gate acts as an S terminal of the RS latch.

2. The level shifter according to claim 1, wherein a source of the second PLDMOS transistor is connected to a gate of the first PMOS transistor and a gate of the first NMOS transistor; and the digital detection block further comprises a second inverter, a third inverter, wherein the first logic gate is a first NAND gate and the second logic gate is a second NAND gate;

an input of the second inverter is connected to the first output of the power supply rail conversion block; an output of the second inverter is connected to a second input of the first NAND gate and an input of the first delay chain; an output of the first delay chain is connected to a first input of the first NAND gate;

an input of the third inverter is connected to the second output of the power supply rail conversion block; an output of the third inverter is connected to a second input of the second NAND gate and an input of the second delay chain; an output of the second delay chain is connected to a first input of the second NAND gate;

an output of the second NAND gate is connected to an R terminal of the RS latch;

an output of the RS latch acts as an output of the level shifter.

3. The level shifter according to claim 2, wherein, the first delay chain comprises odd inverters, and the second delay chain comprises odd inverters.

4. The level shifter according to claim 1, wherein, the first delay chain comprises odd inverters, and the second delay chain comprises odd inverters.

5. The level shifter according to claim 1, wherein the drain of the first NLDMOS transistor is a third output of the power supply rail conversion block;

the drain of the second PLDMOS is a fourth output of the power supply rail conversion block; a source of the second PLDMOS is connected to a gate of the first NMOS transistor and a gate of the first PMOS transistor;

the digital block further comprises a fourth inverter, a fifth inverter, a first NOR gate as the first logical gate, a second NOR gate as the second logical gate, a third NOR gate, a fourth NOR gate, a first AND gate and a second AND gate;

an input of the first delay chain is connected to a first input of the first NOR gate, a first input of the second AND gate and the first output of the power supply rail conversion block; an output of the first delay chain is connected to a second input of the first NOR gate;

an input of the second delay chain is connected to a first input of the second NOR gate, a first input of the first AND gate and the second output of the power supply rail conversion block; an output of the second delay chain is connected to a second input of the second NOR gate;

an input of the fourth inverter is connected to an output of the first NOR gate and a first input of the third NOR gate; an output of the fourth inverter is connected to a second input of the first AND gate and the fourth output of the power supply rail conversion;

an input of the fifth inverter is connected to an output of the second NOR gate and a first input of the fourth NOR gate; an output of the fifth inverter is connected to a second input of the second AND gate and the third output of the power supply rail conversion block;

a second input of the third NOR gate is connected to an output of the first AND gate; an output of the third NOR gate is connected to ithe S terminal of the RS latch;

a second input of the fourth NOR gate is connected to an output of the second AND gate; an output of the fourth NOR gate is connected to thg R terminal of the RS latch; and an output of the RS latch acts as an output of the level shifter.

6. The level shifter according to claim 5, wherein, the first delay chain comprises odd inverters, and the second delay chain comprises odd inverters.

7. The level shifter according to claim 5, wherein, a pull-up circuit is arranged between the power supply rail conversion block and the digital block; the pull-up circuit comprises a third PLDMOS transistor and a fourth PLDMOS transistor, wherein the third PLDMOS transistor is connected to the third output of the power supply rail conversion block and the output of the fifth inverter, and the fourth PLDMOS transistor is connected to the fourth output of the power supply rail conversion block and the output of the fourth inverter;

a source of the third PLDMOS transistor is connected to the power supply of the HV power supply rail; a gate of the third PLDMOS transistor is connected to the output of the fifth inverter, a drain of the third PLDMOS transistor is connected to the third output of the power supply rail conversion block; and a source of the fourth PLDMOS transistor is connected to the power supply of the HV power supply rail; a gate of the fourth PLDMOS transistor is connected to the output of the fourth inverter; a drain of the fourth PLDMOS transistor is connected to the fourth output of the power supply rail conversion.

8. The level shifter according to claim 7, wherein, the first delay chain comprises odd inverters, and the second delay chain comprises odd inverters.

* * * * *